United States Patent [19]

Kurashima

[11] Patent Number: 5,107,145
[45] Date of Patent: Apr. 21, 1992

[54] HIGH SPEED CURRENT MODE LOGIC CIRCUIT WITH CONSTANT LOGIC LEVEL CURRENT

[75] Inventor: Yasumi Kurashima, Tokyo, Japan
[73] Assignee: NEC Corporation, Japan
[21] Appl. No.: 492,639
[22] Filed: Mar. 13, 1990
[30] Foreign Application Priority Data
  Mar. 13, 1989 [JP] Japan .................................. 1-60283
[51] Int. Cl.⁵ .................................................. H03K 3/288
[52] U.S. Cl. ..................................... 307/455; 307/443; 307/264
[58] Field of Search ............... 307/443, 455, 456, 457, 307/272.1, 264

[56] References Cited

U.S. PATENT DOCUMENTS 4,970,417  11/1990  Kubota ............................. 307/455

FOREIGN PATENT DOCUMENTS 0167339  1/1986  European Pat. Off. ........... 307/455
1929144  12/1970  Fed. Rep. of Germany ...... 307/455
0298224  12/1987  Japan ................................. 307/455

Primary Examiner—Timothy P. Callahan
Attorney, Agent, or Firm—Laff, Whitesel, Conte & Saret

[57] ABSTRACT

A collector-dotted current-mode logic circuit which includes a plurality of current-mode logic circuits each containing a first and a second transistors, where the collectors of the first transists and the collectors of the second transistors are respectively connected. A load consisting only of a resistor is connected to the collectors of the first transistors. A load is also connected to the collectors of the second transistors. When the signal level at the collectors of the second transistors is "H", the current supplied by one of the constant current sources that supply currents to the resistor load is bypassed by way of a bypass circuit. As a result, the "L" level at the collector of the first transistor where logic is output, is so controlled as to maintain its constancy for any condition of the logic signal input to this current-mode logic circuit.

11 Claims, 3 Drawing Sheets

HIGH SPEED CURRENT MODE LOGIC CIRCUIT WITH CONSTANT LOGIC LEVEL CURRENT

BACKGROUND OF THE INVENTION

1. Field of the Invention

The present invention relates to current-mode logic (CML) circuits, and more particularly to collector-dotted CML circuits.

2. Description of the Prior Art

Heretofore, a CML circuit has been known as one of the high speed logic circuits. The CML circuit has first and second transistors whose emitters are commonly connected, as its basic units. Of the two transistors the base of the first transistor serves as the input point of a logic signal, and the collector of the second transistor serves as the point of logic output. An emitter coupled logic (ECL) circuit which receives the logic output of a CML circuit with an emitter follower circuit is also frequently employed. These logic circuits are integrated on a silicon substrate as a large scale integrated circuit (LSI) to be used, for instance, as a gate array. Another example is an LSI employing field effect transistors that is integrated on a compound semiconductor substrate using such compound as gallium arsenide. Before proceeding further, it should be mentioned here that in the description that follows there sometimes occur cases in which an ECL circuit is also meant to represent a CML circuit.

In the fabrication of LSIs using CML circuits, when it is desired to construct a complicated logic circuit under the use of restricted supply voltages, there is sometimes employed a circuit known as a collector-dotted CML circuit. In this circuit, the collectors of the second transistors of a plurality of CML circuits are commonly connected.

An example of the use of the collector-dotted CML circuits is MC 10508, an OR-AND gated LSI, manufactured by Motorola, Inc. (see MECL Integrated Circuits Data Book, 1973). In the collector-dotted circuit used in this device, use is made of NPN transistors. Basically, in an individual CML circuit, the base of the first transistor is used as the input terminal of a logic signal while the base of the second transistor is used as the input terminal of a reference potential. The emitters of the first and the second transistors are connected commonly, and also connected to a constant current source or one end of a resistor which performs an operation equivalent to a constant current source. The other end of the constant current source or the resistor is connected to the low potential side of the power supply to the CML circuit. The collector of the second transistor is connected to one end of a load resistor, and the other end of the load resistor is connected to the high potential side of the power supply to the CML circuit. The collector of the second transistor becomes the logic output point of the CML circuit. A collector-dotted CML circuit is a circuit constructed by a plurality of individual CML circuits of the above description where the collectors of the first transistors of the respective CML circuits are connected commonly.

In the collector-dotted CML circuit as described in the above, when a logic signal at a low level (referred to as "L" hereinafter) is simultaneously input to the plurality of CML circuits, currents in number same as that of "L" inputs are supplied from the constant current sources. As a result, the potential at the point of logic output, namely, at the collector of the second transistor (although still at a low level) varies according to the input number of the "L" level signals. In order to reduce the variation, a diode is connected in parallel with the load resistor in the conventional device for clamping the voltage occurring across the load resistor. In the example mentioned above, however, a transistor is employed in place of such a diode.

However, when only one input assumes a logic signal "L" a current is supplied to the load from only one of the constant current sources. The voltage applied to the load is, since it is generally set to be lower than the clamping voltage, and the load resistance of the load is reduced due to the connection of the diode, is diminished than in the case where currents are supplied from a plurality of the constant current sources. Then, the potential at the logic output point is rasied, and as a result, the logic swing, which is defined as the amplitude between the low level and the high level (referred to as "H" hereinafter) where no current is supplied to the load resistor, is diminished.

The logic swing is normally set at 500 to 700 mV. In accordance with an experiment carried out using a collector-dotted CML circuit equivalent to the prior art device it was found that the logic swing was diminished from the value of 600 mV for the case where the load consisted exclusively of a resistor to 530 mV with a decrease of about 70 mV as a result of the connection of a diode. Accordingly, in order to obtain a noise margin equivalent to that in the case of a load consisting only of a resistor, it becomes necessary to increase the logic swing by about 10%. This implies the introduction of an adverse effect such as an increase in the power consumption or a deterioration in the switching speed.

Ordinarily, an electronic circuit such as a gate array that constitutes an LSI is a mixture of general CML circuits and collector-dotted CML circuits. In such a case, the activity ratio of the collector-dotted CML circuits is normally less than 10%. However, the high logic swing that is needed for the conventional collector-dotted CML circuits has to be applied also to all of the CML circuits which would not require it. As a result, the increase in the power consumption of the LSI or the deterioration in the switching speed amount as a whole to a large quantity.

Moreover, it was found that there was generated an increase in the collector-dotted CML circuit due to the presence of a parallel capacitance in the clamping diode that was provided in parallel to the load resistor.

SUMMARY OF THE INVENTION

It is a first object of the present invention to provide a collector-dotted CML circuit which has a stable logic amplitude.

It is a second object of the present invention to provide a collector-dotted CML circuit with high speed of operation.

It is a third object of the present invention to provide a collector-dotted CML circuit with small consumption of power.

The present invention relates to a collector-dotted CML circuit in which the logic output points of a plurality of CML circuits are commonly connected. In the individual CML circuit, the base of a first transistor serves as the input terminal of a logic signal, and the base of a second transistor serves as the input terminal of a reference signal or an inverted logic signal. The emitters of the first and the second transistors are connected to one of the terminals of the power supply to the CML circuit through a common constant current source or a resistor which performs an operation equivalent to that of the constant current source. The collector of the first transistor is connected to the other terminal of the power supply through the parallel circuit of the load resistor and the clamping diode. The collector of the second transistor is connected to the other terminal of the power supply through the load resistor. The logic signal of the CML circuit is output from the collector of the second transistor. A basic collector-dotted CML circuit is formed by connecting both of the collectors of the first transistors of the two CML circuits, and connecting both of the collectors of the second transistors. Moreover, a reference potential is input to the base of the second transistor of at least one of the two CML circuits. Further, the collector of the first transistor is connected to the base of a third transistor either directly or via an emitter follower circuit. The collector of the third transistor is connected to the other terminal of the power supply to the CML circuit, and its emitter is connected to the emitter of either one of the CML circuit that is on the side to which is applied the reference potential.

The common junction of the collector of the second transistor and a load consisting only of a resistor becomes the point of logic output. Analogous to the prior art device, a circuit in which the logic output point of a CML circuit is connected to an emitter follower circuit is called an ECL circuit.

In the collector-dotted CML circuit according to the present invention, when a logic signal "L" is input to either one of the CML circuits, a current is supplied to the load resistor from the constant current source on the side of the CML circuit in question. However, when both of the logic signal inputs to the two CML circuits are at the "L" level, the logic output "H" of the first transistor is transmitted to the base of the third transistor. As a result, the current supplied by the constant current source connected to the CML circuit side to which is connected the third transistor, is bypassed through the third transistor. Consequently, that CML circuit will not supply a current to the load resistor so that when the logic output point is at the low level, current will invariably be supplied from one constant current source alone. Therefore, the logic swing that is output to the load resistor is always maintained at a constant value.

Because of this, even in an LSI in which electronic circuits such as the general CML circuits and the collector-dotted CML circuits coexist, it is possible to design the logic swing of the device to be equivalent to the logic swing of the general CML circuit, whereby providing an LSI with high speed operation or low power consumption.

BRIEF DESCRIPTION OF THE DRAWINGS

The above-mentioned and other objects, features and advantages of the invention will become more apparent by reference to the following detailed description of the invention taken in conjunction with the accompanying drawings, wherein.

DETAILED DESCRIPTION OF THE PREFERRED EMBODIMENTS

Figure 1:
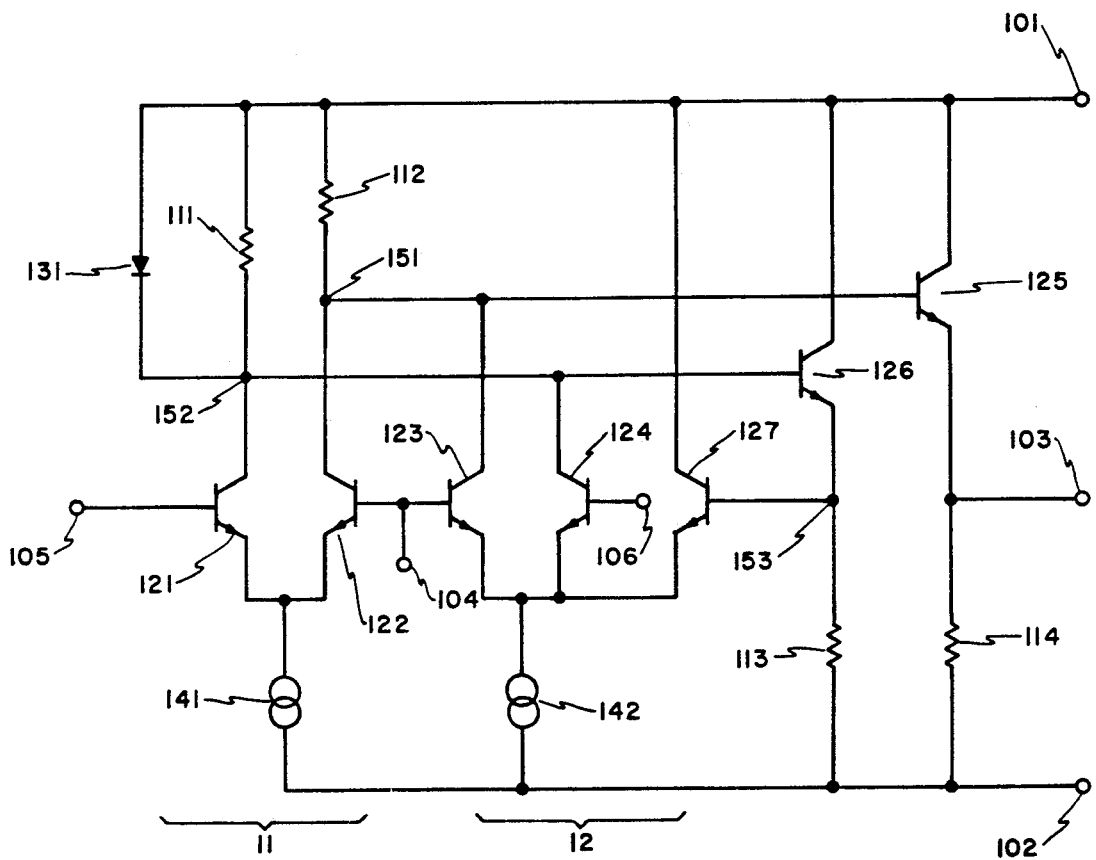
FIG. 1 is a circuit diagram for a two-input AND gate circuit according to a first embodiment of the present invention.

Referring to FIG. 1, the two-input AND gate circuit according to a first embodiment of the present invention employs NPN transistor as active elements, and includes a first and a second CML circuits 11 and 12, respectively.

In the first CML circuit 11, a logic signal is input to the base of a transistor 121 from an input terminal 105, and a reference potential is input to the base of a transistor 122 from an input terminal 104. The emitters of the transistors 121 and 122 are combined and are connected to a low potential terminal 102 of the CML circuit power supply via a constant current source 141. The collector of the transistor 121 is connected to a high potential terminal 101 of the power supply to the CML circuit via the parallel circuit of a resistor 111 and a clamping diode 131. In the second CML circuit 12, the reference potential same as that of the first CML circuit is input from the input terminal 104 to the base of a transistor 123, and another logic signal is input to a transistor 124 from an input terminal 106. The emitters of the transistors 123 and 124 are combined and are connected to the low potential terminal 102 via a constant current source 142. The collectors of the transistors 122 and 123 are commonly connected at a first common junction 151, and the collectors of the transistors 121 and 124 are commonly connected at a second common junction 152, whereby completing a collector-dotted CML circuit. The first common junction 151 where the collectors of the transistors 122 and 123, and one end of a load resistor 112 are commonly connected serves as the logic output point of the collector-dotted CML circuit.

The embodiment shown in FIG. 1 further includes emitter follower transistors 125 and 126 and a transistor 127 for bypassing according to the present invention. The base of the transistor 125 is connected to the first common junction 151 of the collector-dotted CML circuit. An emitter follower circuit is constructed by connecting the collector of the transistor 125 to the high potential terminal 101, and its emitter to the low potential terminal 102 via a resistor 114. An output terminal 103 of the logic signal is connected to the emitter of the transistor 125. The base of the transistor 126 is connected to the second common junction 152 of the collector-dotted CML circuit. Another emitter follower circuit is constructed by connecting the collector of the transistor to the high potential terminal 101, and its emitter to the low potential terminal 102 via a resistor 113. The emitter of the transistor 126 is connected to the base of the bypassing transistor 127 at a node 153. The collector and the emitter of the transistor 127 are connected to the high potential terminal 101 and the emitter of the transistor 124 of the second CML circuit 12, respectively.

Further, it should be noted that the diode 131 may be replaced by a transistor that performs the clamping, and the constant current sources 141 and 142 may be replaced by resistors.

In the embodiment shown in FIG. 1, there is not provided a diode for clamping the "L" level voltage in parallel with the load transistor 112. This fact, combined with the provision of the bypassing transistor 127, leads to the constancy of the low potential of the logic output which gives rise to an effect that the switching speed at the logic output point 151 is enhanced.

Next, the operation of the two-input AND gate in FIG. 1 will be described.

When the logic signals input to the input terminals 105 and 106 are both at the "H" level, the levels of the signals at the second common junction 152 and the node 153 are respectively at the "L" levels. At this time, the logic output at the first common junction 151 is the "H" level, and a current is supplied to the load resistor 112 neither from the constant current source 141 nor from 142.

When the level of either one of the logic signals input to the input terminals 105 and 106 (105, for example) is "H", either one of the transistors 122 and 123 (123, for example) becomes the on-state. As a result, currents are supplied to both of the parallel circuit of the resistor 111 and the diode 131 and the load resistor 112 respectively from the constant current sources 141 and 142. Then, the first and the second common junctions 151 and 152 respectively go to "L" levels, and the logic levels at the output terminal 103 and the node 153 both go to "L" levels. In this case, either one of the transistors 122 and 123 is brought to the on-state. Moreover, both will not be brought to the on-state simultaneously, so that a current will be supplied to the load resistor from only one of the constant current sources 141 and 142 (142, in the above example). Accordingly, the low level at the logic output point 151 will be the same level as in the case of an individual CML circuit in which there is not connected the collector of the transistor 122.

When both of the logic signals input to the input terminals 105 and 106 are at the "L" levels, a current will be supplied to the parallel circuit of the resistor 111 and the diode 131 neither from the constant current 141 nor from 142. Therefore, the levels at the second common junction 152 and the node 153 go to the "H" levels, and the bypassing transistor 127 becomes the on-state. Accordingly, the current supplied from the constant current source 142 flows bypassing the transistor 127, and a current is supplied to the load resistor 112 through the transistor 122 which is in the on-state only from the constant current source 141. Hence, the low level at the logic output point 151 in this case becomes also the same as that in the case of the individual CML circuit.

As described in the above, in the present embodiment, the logic output is taken out from the side of the load consisting of a resistor alone. In addition, when either one or both of the two logic input signals are at the "L" levels in which case a current is supplied to the load resistor 112, the current is supplied to the load resistor always from only one of the constant current source. Accordingly, the logic swing of the collector-dotted CML circuit can always be made equal to the logic swing of the individual CML curcuit. This means that the logic swing for this circuit can be made smaller than the logic swing required for the prior art circuit in which a clamping diode is connected in parallel to the load resistor 112. Owing to the effect of reducing the logic swing, it becomes possible to increase the switching speed of the circuit. In the event that the conventional switching speed is acceptable, it becomes possible to reduce the power consumption by decreasing the current to be supplied to the load resistor. Further, the time constant of the load circuit can be made smaller than in the case of connecting a clamping diode in parallel with the load resistor 112, due to the reduction in the capacitance by the parallel capacitance of the diode, so that the switching speed of the CML circuit can be increased.

Moreover, the load on the collectors of the transistors 121 and 124 that are on the side where no logic signal is output, is the parallel circuit of the resistor 111 and the diode 131. Accordingly, when either one alone of the logic signal inputs to the input terminals 105 and 106 is at the "H" level, the "L" level of the node 153 goes up. However, the logic output at the node 153 is not connected to any other electronic circuit, so that there is no possibility of having the noise margin reduced.

Figure 2:
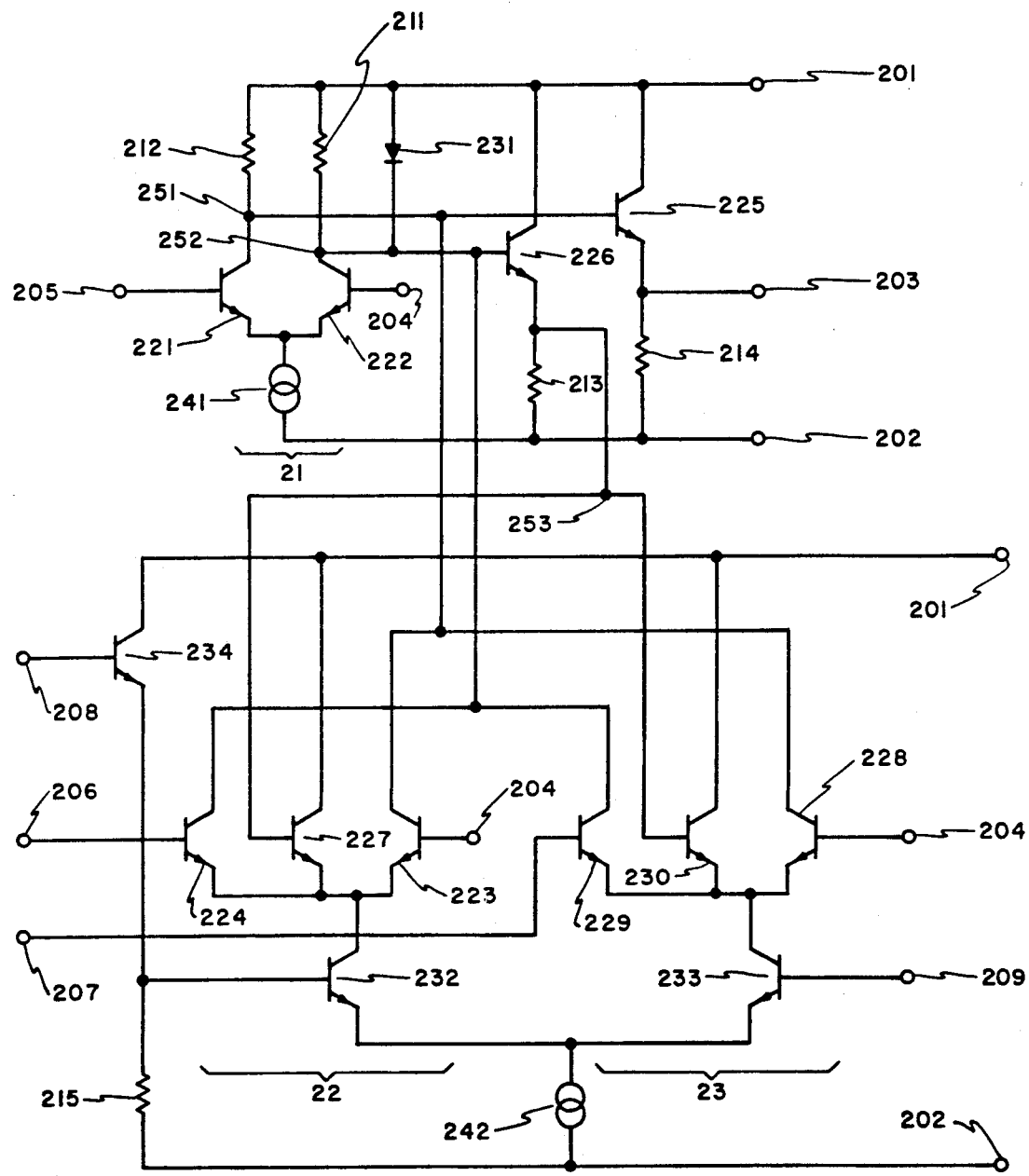
FIG. 2 is a circuit diagram for a two-input data selector with an enable signal terminal according to a second embodiment of the present invention.

Referring to FIG. 2, the two-input data selector with enable signal terminal according to a second embodiment of the present invention is constructed by three CML circuits 21, 22 and 23. It is to be noted in this circuit that the second and the third CML circuits 22 and 23 share a constant current source so that this device could be regarded as substantially having two CML circuits. The first CML circuit 21 is a switching circuit using an enable signal input, and the second and the third CML circuits 22 and 23, respectively, are used for selecting a two-input data.

The first CML circuit 21 includes a pair of transistors 221 and 222. An enable signal is input to the base of the transistor 221 from an input terminal 205, and a reference potential is input to the base of the transistor 222 from a reference potential applying terminal 204. The emitters of the transistors 221 and 222 are combined, and are connected to the low potential terminal 202 of the CML circuit power supply via a constant current source 241. The collector of the transistor 222 is connected to the high potential terminal 202 of the CML circuit power supply via a load resistor 212. The collector of the transistor 222 is connected to the high potential terminal 201 via the parallel circuit of a resistor 211 and a clamping diode 231.

The second CML circuit 22 includes a pair of transistors 223 and 224. The reference potential same as that of the first CML curcuit 21 is input to the base of the transistor 223 from the reference potential applying terminal 204, and a data is input to the base of the transistor 224 from an inupt terminal 206. The emitters of the transistors 223 and 224 are combined, and are connected to the collector of a transistor 232. The emitter of the transistor 232 is connected the low potential terminal 202 via a constant current source 242. The transistor 232 operates as the switch for selecting an input terminal for a data, becomes on-state when the second CML curcuit 22 is selected as the data input circuit, whereby connecting the second CML circuit to the constant current circuit 242.

The third CML circuit 23 includes a pair of transistors 228 and 229. The reference potential same as that for the first CML circuit 21 is input to the base of the transistor 228 from the reference potential applying terminal 204, and a data is input to the base of the transistor 229 from an input terminal 207. The emitters of the transistors 228 and 229 are combined and connected to the collector of a transistor 233. The emitter of the transistor 233 is connected to the low potential terminal 202 via the constant current source 242. The transistor 233 operates as the switch for selecting an input terminal for the data, and becomes on-state when the third CML circuit 23 is selected as the data input circuit, whereby connecting the third CML circuit to the constant current circuit 242.

The transistors 232, 233 and 234 constitute a selection circuit for a data. The base of the transistor 234 is connected to an input terminal 208 where there is input a select signal, its collector is connected to the high potential terminal 201, and its emitter is connected to the low potential terminal 202 via a resistor 215. Further, the emitter of the transistor 234 is connected to the base of the transistor 232. The reference potential is applied to the base of the transistor 233 from the reference potential application terminal 209.

The collectors of the transistors 221, 223 and 238 are connected to one end of the load resistor 212 and to a first common junction 251, and the common junction point 251 serves as the logic output of the collector-dotted CML circuit. The collectors of the transistors 222, 224 and 229 are similarly connected to a second common junction 252.

The embodiment in FIG. 2 further includes emitter followers 225 and 226 and bypassing transistors 227 and 230. The base of the transistor 225 is connected to the first common junction 251. The collector of the transistor 225 is connected to the high potential terminal 201, its emitter is connected to the low potential terminal 202 via a resistor 214, whereby completing an emitter follower circuit. The emitter of the transistor 225 is also connected to the output terminal 203 of the data. The base of the transistor 226 is connected to the second common junction 252. The collector of the transistor 226 is connected to the high potential terminal 201, its emitter is connected to the low potential terminal 202 via a resistor 213, completing an emitter follower. The emitter of the transistor 226 is connected to the bases of the transistors 227 and 230 at a third common junction 253. The collector of the transistor 227 is connected to the high potential terminal 201 and its emitter is connected to the emitter of the transistor 223. The collector of the transistor 230 is connected to the high potential terminal 201, and its emitter is connected to the emitter of the transistor 228.

Figure 3:
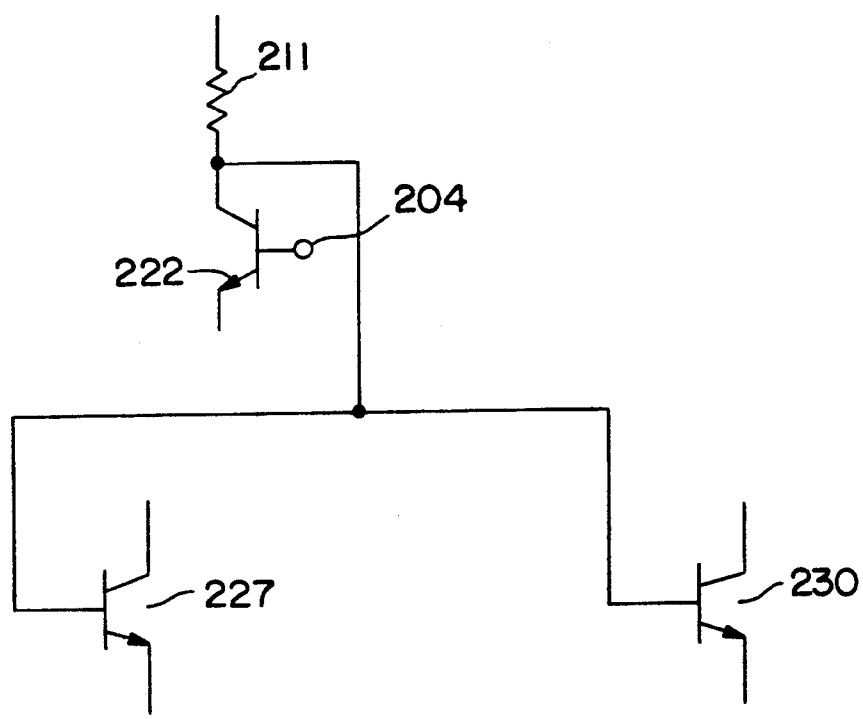
FIG. 3 shows a fragment of FIG. 2 with an alternative connection between three transistors.

FIG. 3 shows a fragment of the circuit of FIG. 2 wherein the base electrodes of transistors 227, 230 are connected directly to the collector of transistor 222 instead of being connected there via an emitter follower circuit 226. Otherwise, FIG. 3 is identical with FIG. 2.

Next, the operation of the two-input data selector with enable signal terminal shown in FIG. 2 will be described.

When a select signal of "H" is input to the input terminal 208, the transistors 234 and 232 are turned on, and the second CML circuit 22 and the transistor 227 are selected. Then, the data input from the data input terminal 206 is activated. Conversely, when a select signal "L" is input to the input terminal 208, the transistor 233 to which is applied the reference potential from the reference potential application terminal 209 is turned on. Then, the third CML circuit 23 and the transistor 230 are selected, and the data input from a data input terminal 207 is activated.

When an enable signal "L" is input to the input terminal 205, the data, out of the data input to the input terminals 206 and 207, on the side selected by the select signal is output to the output terminal 203. When an enable signal "H" is input to the input terminal 205, the base input level of the transistor 225 is always kept at "L", and as a result the output level of the output terminal 203 goes to "L".

In the present collector-dotted CML circuit, the transistor of the first CML circuit 21 provided with the enable signal is in the reversed relation to that of the embodiment in FIG. 1. Accordingly, in the case of the combination of an enable signal "H" and a data signal "L", the current supplied from the constant current source 242 is bypassed by the transistor 227 or 230.

When an enable signal "L" is input to the input terminal 205, and the data level at the input terminal 206 or 207 that is selected by a logic signal that is input to the input terminal 208 is "L", the level of the second common junction 252 goes to "L". Accordingly, the level of the common junction 253 goes to "L". As a result, the transistor 227 or 230 is turned off, and the transistor 223 or 228 is turned on. On the other hand, the transistor 221 is in the off-state so that the current that flows into the load resistor 212 is supplied from only the constant current source 242 through the transistor 223 or 228.

When an enable signal "L" is input to the input terminal 205, and the data level at the selected input terminal 206 or 207 is "H", the level at the third common junction 253 is "L". The transistor 224 or 229 in this case is in the on-state. Accordingly, both of the transistors 223 and 228 are both turned off. On the other hand, the transistor 221 is in the off-state so that no current will flow into the load resistor 212.

When an enable signal "H" is input to the input terminal 205, and the data level at the selected input terminal 206 or 207 is "L", the level at the third common junction 253 goes to "H". As a result, either one of the transistors 227 and 230 goes to the on-state, and the transistor that is brought to the on-state bypasses the current supplied from the constant current source 242. At this time, both of the transistors 223 and 228 are in the off-state, and the current that flows in the load resistor 212 is supplied from only the constant current source 241 through the transistor 221.

When an enable signal "H" is input to the input terminal 205, and the data level at the selected input terminal 206 or 207 is "H", both of the transistors 223 and 228 are in the off-state. Accordingly, the current that flows in the load resistor 212 is supplied from only the constant current source 241 through the transistor 221.

In the first and the second embodiments, the transistors 127 and 227 (or 230) that bypass the current from the constant current source are connected to a CML circuit that satisfies the following conditions. This CML circuit is a circuit in which the load of the collector consists of a resistor alone, and has a transistor to whose base is applied the reference potential. When the transistors of both of the CML circuits satisfy these conditions as in the embodiment shown in FIG. 1, the bypassing transistor is connected to either one of these CML circuits.

The transistors to be used in the present invention need not be limited to the NPN transistors, and the PNP transistors or the FETs can also be made use of. When the PNP transistors are used, the high potential terminal and the low potential terminal are set opposite to what has been described in the foregoing. Further, when the FETs are used, the drain, gate and source of the FET are used corresponding to the collector, base and emitter of the NPN transistor, respectively.

As in the above, in the collector-dotted CML circuit, the load on the side of logic output consists of a resistor alone, while the load on the side of absence of logic output, namely, the side of the inverted logic output consists of a parallel circuit of a resistor and a clamping diode. When the level of the side of the inverted logic output becomes "H", out of the current to be passed into the load resistor on the side of logic output, a portion of the current corresponding to one of the constant current source is bypassed. Accordingly, when current flows in the load current on the logic output, it is arranged so as to always permit the passage of a current for the portion corresponding only to one of the constant current sources, so that there will arise no variations in the logic swing of the logic signal. As a result, even when the logic swing is set to be that equivalent to the individual CML circuit, there will occur no deterioration in the noise margin. Consequently, the present invention has an effect that it becomes possible to reduce the logic swing by about 70 mV from the value for the case of obtaining the logic output by means of a load consisting of a resistor and a clamping diode, whereby enhancing the speed of circuit operation. In the event that there is not needed an increase in the speed of circuit operation, it becomes possible to diminish the power consumption of the circuit by reducing the load current. Moreover, no diode is connected in the load on the side of logic output, so that the time constant of the circuit can be reduced, and the switching speed of the circuit can be improved.

Although the invention has been described with reference to specific embodiments, this description is not meant to be construed in a limiting sense. Various modifications of the disclosed embodiments, as well as other embodiments of the invention, will become apparent to persons skilled in the art upon reference to the description of the invention. It is therefore contemplated that the appended claims will cover any modifications or embodiments as fall within the true scope of the invention.

What is claimed is:

1. A collector-dotted current-mode logic circuit comprising:
    a first current-mode logic circuit section which includes first and second transistors with their respective emitters commonly connected, a first load resistor and a clamping diode connected in parallel between the collector of said first transistor and a first voltage terminal, a second load resistor connected between the collector of said second transistor and said first voltage terminal, and a first constant current source connected between the emitters of said first and second transistors and a second voltage terminal;
    a second current-mode logic circuit section which includes third and fourth transistors with the respective emitters commonly connected, and a second constant current source connected between the emitters of said third and fourth transistors and said second voltage terminal, the collector of said third transistor being connected to the collector of said first transistor, said first load resistor and said clamping diode, the collector of said fourth transistor being connected to the collector of said second transistor and said second load resistor;
    means for bypassing the current from one of said first and second constant current sources to prevent it from flowing through said second load resistor when both of said second and fourth transistors are in a conductive state;
    a first input terminal connected to the base of said first transistor;
    a second input terminal connected to the base of said third transistor;
    a reference voltage terminal connected to the bases of said second and fourth transistors; and
    a means for generating an output signal based on a voltage drop across said second load resistance.

2. A collector-dotted current-mode logic circuit as claimed in claim 1, wherein said maintaining means comprises:
    a fifth transistor with its collector connected to said first voltage terminal and its emitter connected to the emitter of said fourth transistor; and
    means for transmitting the collector potential of said third transistor to the base of said fifth transistor.

3. A collector-dotted current-mode logic circuit comprising:
    a first current-mode logic circuit section which includes first and second transistors with the respective emitters commonly connected, a first load resistor and a clamping diode connected in parallel between the collector of said first transistor and a first voltage terminal, a second load resistor connected between the collector of said second transistor and said first voltage terminal, and a first constant current source connected between the emitters of said first and second transistors and a second voltage terminal of said power supply;
    a second current-mode logic circuit section which includes a third and a fourth transistors with the respective emitters commonly connected, and a second constant current source connected between the emitters of said third and fourth transistors and said second voltage terminal, the collector of said third transistor being connected to the collector of said fourth transistor and the collector of said fourth transistor being connected to the collector of said second transistor;
    means for applying a reference potential to at least one of said second and fourth transistors;
    a fifth transistor with its collector connected to said first voltage terminal with its base connected directly or via an emitter follower circuit to the collector of said first transistor, and its emitter connected to the emitter of said second or fourth transistor to which is applied said reference potential; and
    a logic output terminal connected to a junction of said second load resistor and the collectors of said seocnd and fourth transistors.

4. A collector-dotted current-mode circuit comprising:
    a first current-mode logic circuit section which includes a first and a second transistors with their respective emitters commonly connected, a first load resistor connected between the collector of said first transistor and a first voltage terminal, a second load resistor and a clamping diode connected in parallel between the collector of said second transistor and said first voltage terminal, and a first constant current source connected between the emitters of said first and second transistors and a second voltage terminal;
    a second current-mode logic circuit section which includes a plurality of current-mode logic circuits, each of these circuits having a third, a fourth and a fifth transistor with their respective emitters commonly connected, a logic signal input terminal connected to the base of said third transistor, a reference potential application terminal connected to the base of said fifth transistor, with the collector of said fourth transistor being connected to the first voltage terminal, a two terminal switching circuit having one of its terminals connected to said commonly connected emitters of said third, fourth and fifth transistors of each of the current-mode logic circuit and the other of its terminals commonly connected, and a second constant current source connected between said switching circuit and said second voltage terminal, the collectors of said third transistors of said plurality of current-mode logic circuits being connected to the collector of said second transistor, the bases of said fourth transistors being connected to the collector of said second transistor via an emitter follower circuit, and the collectors of said fifth transistors being connected to the collector of said first transistor; and means for selecting one of said plurality of current-mode logic circuits of said second current-mode logic circuit section by controlling said switching circuit and setting it at the on-state;

whereby the low level at the collector of said second transistor is maintained constant regardless of the input level of the logic signals input to said first current-mode logic circuit part and said selected CML circuit.

5. An AND gate circuit with an enable signal terminal comprising:

a first current-mode logic circuit section which includes a first and a second transistor with their respective emitters commonly connected, a first load resistor connected between the collector of said first transistor and a first voltage terminal, a second load resistor and a clamping diode connected in parallel between the collector of said second transistor and said first voltage terminal, and a first constant current source connected between the emitters of said first and second transistors and said second voltage terminal· a second current-mode logic circuit section which includes a third, a fourth and a fifth transistor with their respective emitters commonly connected, a sixth transistor with its collector connected to the emitters of said third, fourth and fifth transistors, a first logic signal input terminal connected to the base of said third transistor, and a first reference potential application terminal connected to the base of said fifth transistor, the collector of said third transistor being connected to the collector of said second transistor, the collector of said fourth transistor being connected to said first voltage terminal and its base being connected to the collector of said second transistor via an emitter follower, and the collector of said fifth transistor being connected to the collector of said first transistor;

a third current-mode logic circuit section which includes a seventh, an eighth and a ninth transistor with their respective emitters commonly connected, a tenth transistor with its collector connected to the emitters of said seventh, eighth and ninth transistors, a second logic signal input terminal connected to the base of said seventh transistor, and a second reference potential application terminal connected to the base of said tenth transistor, the collector of said seventh transistor being connected to the collector of said third transistor, the collector of said eighth transistor being connected to said first voltage terminal and its base being connected to the base of said fourth transistor, and the collector of said ninth transistor being connected to the collector of said fifth transistor and its base being connected to said first reference potential application terminal;

a second constant current source connected between the emitters of said sixth and tenth transistors and said second voltage terminal which is shared by said second and third current-mode logic circuit parts;

a selection circuit section which includes an eleventh transistor that has its collector connected to the first voltage terminal, its emitter being connected to the base of said transistor and also to said second voltage terminal via a resistor, and a selection terminal connected to the base of said eleventh transistor; and a logic output terminal connected via an emitter-follower to a junction of collectors of said first, fifth and ninth transistors.

6. In a collector-dotted current-mode logic circuit as claimed in claim 1, 2 or 3, the collector-dotted current-mode logic circuit, and an output transistor having its base connected to the collector of said second transistor, its collector connected to the first voltage terminal, and its emitter connected to said second voltage terminal via a resistor; and the logic output being taken out from the emitter of said output transistor.

7. A current-mode logic circuit comprising:

a first, a second, a third, a fourth and a fifth transistor, each having a first and a second current terminal and a control terminal;

a first constant current source with one terminal commonly connected to the second current terminal of said first and second transistors and another terminal of said first constant current source connected to a first terminal of a two terminal power supply;

a second constant current source with one terminal commonly connected to the second current terminals of said third, fourth and fifth transistors and another terminal connected to the first terminal of said power supply;

first means commonly connecting the first current terminals of said first and third transistors and also connecting these terminals to the other terminal of said power supply;

a load means having one terminal commonly connected to said current terminals of said second and fourth transistors and another terminal connected to the other terminal of said power supply;

a second means for transmitting a potential of said first current terminals of said and third transistors to the control terminal of said fifth transistor;

a first logic signal terminal connected to the control terminal of said first transistor;

a second logic signal input terminal connected to the control terminal of said third transistor;

a reference potential input terminal connected to the control terminals of said second and fourth transistors;

a logic signal output terminal; and third means for transmitting a signal at the first current terminal of said second and fourth transistors to said logic signal output terminal;

whereby the first current terminal of said fifth transistor is connected to the other terminal of said power supply.

8. A current-mode logic circuit as claimed in claim 7, wherein said first means includes load means and clamping means that are connected in parallel.

9. A current-mode logic circuit as claimed in claim 7, wherein said second means includes a sixth transistor the control terminal of said sixth transistor is connected to the first current terminal of said first and third transistor, the first current terminal of said sixth transistor is connected to the other terminal of said power supply, and the second current terminal of said sixth transistor is connected to the control terminal of said fifth transistor as well as to the one terminal of said power supply via a resistor.

10. A collector-dotted current-mode circuit comprising:
- a first current-mode logic circuit section which includes a first and a second transistor with their respective emitters commonly connected, a first load resistor connected between the collector of said first transistor and a first voltage terminal, a second load resistor and a clamping diode connected in parallel between the collector of said second transistor and said first voltage terminal, and a first constant current source connected between the emitters of said first and second transistors and a second voltage terminal;
- a second current-mode logic circuit section which includes a plurality of current-mode logic circuits, each of these circuit having a third, a fourth and a fifth transistor with their respective emitters commonly connected, a logic signal input terminal connected to the base of said third transistor, a reference potential application terminal connected to the base of said fifth transistor, with the collector of said fourth transistor being connected to the first voltage terminal, a two terminal switching circuit having one of its terminals connected to said commonly connected emitters of said third, fourth and fifth transistors of each of the current-mode logic circuit and the other of its terminals commonly connected, and a second constant current source connected between said switching circuit and said second voltage terminal, the collectors of said third transistors of said plurality of current-mode logic circuits being connected to the collector of said second transistor, the bases of said fourth transistors being connected directly to the collector of said second transistor, and the collectors of said fifth transistors being connected to the collector of said first transistor; and
- means for selecting one of said plurality of current-mode logic circuits of said second current-mode logic circuit section by controlling said switching circuit and setting it at the on-state;
- whereby the low level at the collector of said second transistor is maintained constant regardless of the input level of the logic signals input to said first current-mode logic circuit part and said selected CML circuit.

11. An AND gate circuit with an enable signal terminal comprising:
- a first current-mode logic circuit section which includes a first and a second transistor with their respective emitters commonly connected, a first load resistor connected between the collector of said first transistor and a first voltage terminal, a second load resistor and a clamping diode connected in parallel between the collector of said second transistor and said first voltage terminal, and a first constant current source connected between the emitters of said first and second transistor and said second voltage terminal;
- a second current-mode circuit section which includes a third, a fourth and a fifth transistor with their respective emitters commonly connected, a sixth transistor with its collector connected to the emitters of said third, fourth and fifth transistors, a first logic signal input terminal connected to the base of said third transistor, and a first reference potential application terminal connected to the base of said fifth transistor, the collector of said third transistor being connected to the collector of said second transistor, the collector of said fourth transistor being connected to said first voltage terminal and its base being connected directly to the collector of said second transistor, and the collector of said fifth transistor being connected to the collector of said first transistor;
- a third current-mode logic circuit section which includes a seventh, an eighth and a ninth transistor with their respective emitters commonly connected, a tenth transistor with its collector connected to the emitters of said seventh, eighth and ninth transistors, a second logic signal input terminal connected to the base of said seventh transistor, and a second reference potential application terminal connected to the base of said tenth transistor, the collector of said seventh transistor being connected to the collector of said third transistor, the collector of said eighth transistor being connected to said first voltage terminal and its base being connected to the base of said fourth transistor, and the collector of said ninth transistor being conneced to the collector of said fifth transistor and its base being connected to said first reference potential application terminal;
- a second constant current source connected between the emitters of said sixth and tenth transistors and said second voltage terminal which is shared by said second and third current-mode logic circuit parts;
- a selection circuit section which includes an eleventh transistor that has its collector connected to the first voltage terminal, its emitter being connected to the base of said sixth transistor and also to said second voltage terminal via a resistor, and a selection terminal connected to the base of said eleventh transistor; and
- a logic output terminal connected via an emitter-follower to a junction of collectors of said first, fifth and ninth transistors.

* * * * *